US012307181B2

(12) United States Patent
Sescila et al.

(10) Patent No.: US 12,307,181 B2
(45) Date of Patent: May 20, 2025

(54) SYSTEMS AND METHODS FOR TRANSPARENT FPGA RECONFIGURATION

(71) Applicant: Dell Products L.P., Round Rock, TX (US)

(72) Inventors: Glen Sescila, Austin, TX (US); Srikrishna Ramaswamy, Austin, TX (US)

(73) Assignee: DELL PRODUCTS L.P., Round Rock, TX (US)

( * ) Notice: Subject to any disclaimer, the term of this patent is extended or adjusted under 35 U.S.C. 154(b) by 482 days.

(21) Appl. No.: 17/871,456

(22) Filed: Jul. 22, 2022

(65) Prior Publication Data

US 2024/0028805 A1 Jan. 25, 2024

(51) Int. Cl.
*G06F 30/347* (2020.01)

(52) U.S. Cl.
CPC .................................. *G06F 30/347* (2020.01)

(58) Field of Classification Search
CPC ..................................................... G06F 30/347
USPC ......................................................... 716/117
See application file for complete search history.

(56) References Cited

U.S. PATENT DOCUMENTS 5,970,254 A * 10/1999 Cooke ................ G06F 15/7867 712/1
12,192,023 B2 * 1/2025 Sen ..................... G06F 12/0813
2004/0236556 A1 * 11/2004 Lin ......................... G06F 30/33 703/14
2011/0307233 A1 * 12/2011 Tseng .................... G06F 30/347 703/21
2014/0281169 A1 * 9/2014 Mehrotra ............ G06F 12/0866 711/103
2015/0100758 A1 * 4/2015 Rogers .................. G06F 9/3851 712/22
2020/0387330 A1 * 12/2020 Cassia .................. G06F 3/0656
2022/0086226 A1 * 3/2022 Jain ....................... G06F 13/105

OTHER PUBLICATIONS

SNIA Advancing storage & information technology, Smart Data Accelerator Interface ("SDXI") Specification, Version 0.9.0 rev 1, Jul. 2021 (109 pages).
Intel Quartus Prime Pro Edition User Guide, Partial Refiguration, Version Jan. 11, 2022, Updated for Intel® Quartus® Prime Design Suite: 21.4 (149 pages).
Iyer, Shyam, et al., SNIA SDXI TWG and Its Forays Towards Standardizing Memory Data Movement, Persistent Memory Computational Storage, May 24-25, 2022 (24 pages).

* cited by examiner

*Primary Examiner* — Jack Chiang
*Assistant Examiner* — Suchin Parihar
(74) *Attorney, Agent, or Firm* — Chamberlain, Hrdlicka, White, Williams & Aughtry; Aly Z. Dossa

(57) ABSTRACT

A system or method for offloading data operations to a field programmable gate array (FPGA), that includes loading, by the FPGA, a descriptor ring, performing a first lookup, in the descriptor ring, to identify a first descriptor entry, identifying, in the first descriptor entry, a first data operation, making a first determination that the first data operation is unavailable in any of a plurality of module slots of the FPGA, and based on the first determination, loading a first operation module, matching the first data operation, into a first swappable module slot of the plurality of module slots.

16 Claims, 4 Drawing Sheets

Computing Device 100
Peripheral Bus 104
Field Programmable Gate Array (FPGA) 102
Accelerator Command Handler 108
Module Slot Tracker 109
Descriptor Ring 110
Descriptor Tracker 111
Static Module Slot A 114A
Static Module Slot N 114N
Swappable Module Slot A 116A
Swappable Module Slot N 116N
Module Loader 112
Module Library 106
Operation Module A 118A
Operation Module N 118N

SYSTEMS AND METHODS FOR TRANSPARENT FPGA RECONFIGURATION

BACKGROUND

Devices and/or components of devices are often capable of performing certain functionalities that other devices and/or components are not configured to perform and/or are not capable of performing. In such scenarios, it may be desirable to adapt one or more systems to enhance the functionalities of devices and/or components that cannot perform the one or more functionalities.

DETAILED DESCRIPTION

Figure 1:
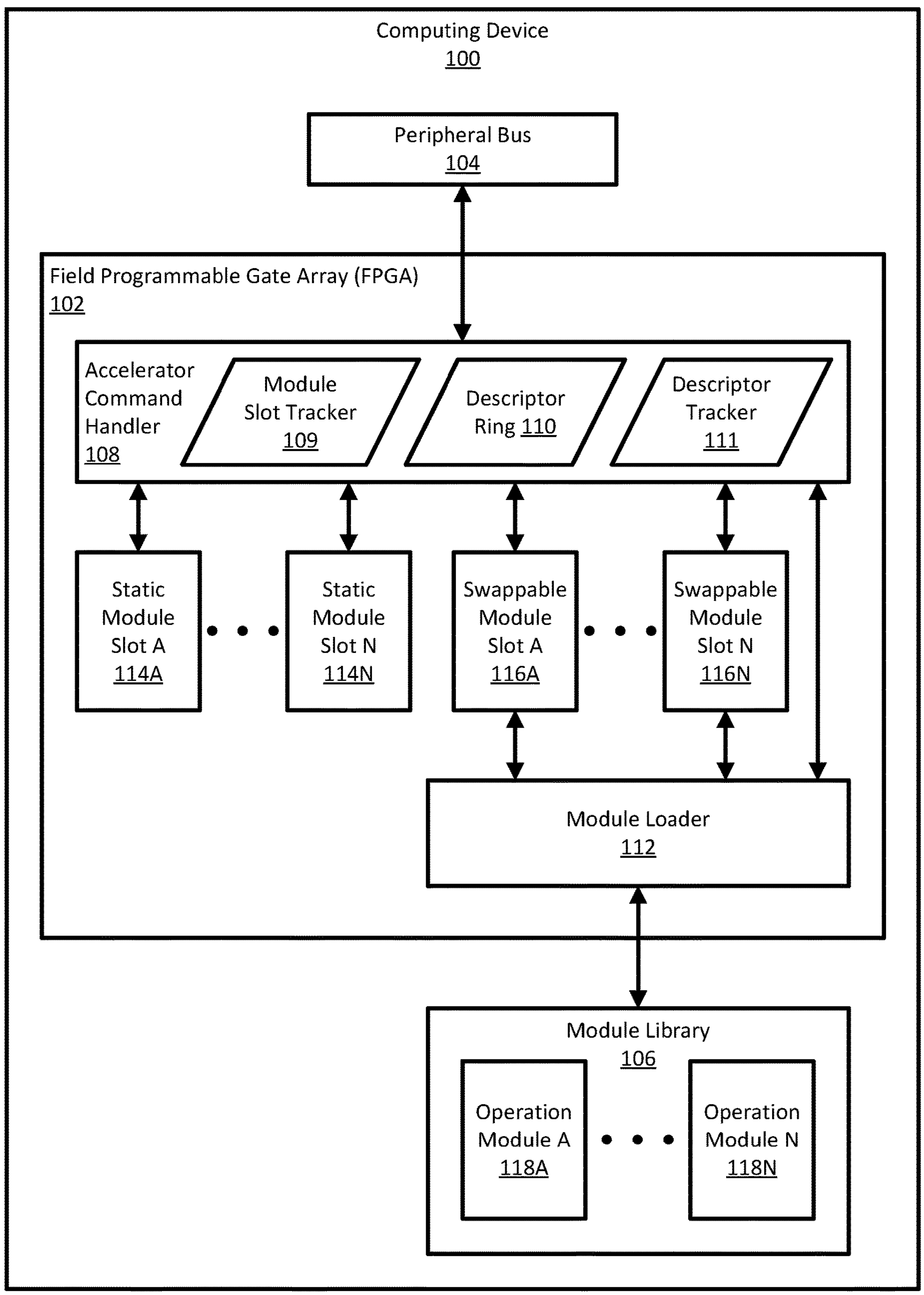
FIG. 1 shows a diagram of system, in accordance with one or more embodiments.

In general, embodiments relate to system and methods for dynamically configuring a field programmable gate array (FPGA) to handle offloaded data operations. In conventional systems, "hardware offloading" may be achieved by taking data operations that are normally performed "in software" (i.e., processed on a general-purpose processor) and providing those data operations to an integrated circuit that is custom built (or custom configured) to more quickly perform those task(s). However, the hardware used for hardware offloading may be specially configured such that it may only be able to process a few (or one) type(s) of data operation. Accordingly, to offload a meaningful portion of the data operations normally performed by the general-purpose processor, additional specialized hardware is required, or a configurable integrated circuit may be used (e.g., an FPGA).

An FPGA provides benefits over non-configurable integrated circuits (e.g., application-specific integrated circuits (ASICs)) because an FPGA may be reconfigured by an end user to handle different data operation(s) than initially configured to process. That is, a user may reconfigure an FPGA to allow for the offloading of one or more particular data operations that are slow to process in a general-purpose processor. However, an FPGA is only capable of being configured to perform some limiting number of data operations. That is, as a non-limiting example, if an FPGA is capable of supporting five unique types of data operations at once, there may be dozens of other types of data operations that the FPGA is not configured to accept for hardware offloading.

One workaround to the FPGA's limited capacity is to introduce specialized software, executing in user space, that identifies upcoming data operations and reconfigures the FPGA (in advance) to be able to handle those upcoming data operations. However, such a method requires user space software (often proprietary) that provides no transparency to the larger computing device (on which the FPGA resides). Accordingly, standards and protocols—that might normally utilize the FPGA—are unable to use the FPGA as the FPGA's current configuration is unknown (without using the user space software).

Accordingly, as disclosed in one or more embodiments herein, an FPGA may be configured to include one or more "swappable module slots" that are independently reconfigured to handle upcoming data operations (by the FPGA itself). That is, some portions of the FPGA are dynamically reconfigured by analyzing upcoming (or queued) data operations and proactively loading an "operation module" (into a swappable module slot) that can process the data operation (i.e., a partial reconfiguration may be performed on the FPGA). Accordingly, the data operation may be offloaded to the FPGA (from the general-purpose processor) such that the FPGA processes the data operation when needed.

Further, using one or more embodiments disclosed herein, standardized techniques for hardware-to-software offloading (e.g., the smart data accelerator interface (SDXI)) may be utilized. As the partial reconfiguration of the FPGA occurs in and by the FPGA itself, no additional software (executing in user space) is required to utilize the reconfiguration capabilities of the FPGA. Accordingly, the configuration changes made to the FPGA are transparent to any component of the larger computing device thereby allowing existing standards and infrastructure to more easily utilize the FGPA's functionalities.

Specific embodiments will now be described with reference to the accompanying figures. In the following description, numerous details are set forth as examples of one or more embodiments. One of ordinary skill in the art, having the benefit of this detailed description, would appreciate that one or more embodiments in this disclosure may be practiced without the specific details disclosed and that numerous variations or modifications may be possible and still remain in the scope of this detailed description. Certain details, known to those of ordinary skill in the art, may be omitted to avoid obscuring the description.

In the following description of the figures, any component described with regard to a figure, in various embodiments, may be equivalent to one or more like-named components shown and/or described with regard to any other figure. For brevity, descriptions of these components may not be repeated with regard to each figure. Thus, each and every embodiment of the components of each figure is incorporated by reference and assumed to be optionally present within every other figure having one or more like-named components. Additionally, in accordance with various embodiments, any description of any component of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements, nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the term 'operatively connected', or 'operative connection', means that there exists between elements/components/devices a direct or indirect connection that allows the elements to interact with one another in some way (e.g., via the exchange of information). For example, the phrase 'operatively connected' may refer to any direct (e.g., wired connection or wireless connection directly between two devices) or indirect (e.g., wired and/or wireless connections between any number of devices connecting the operatively connected devices) connection.

As used herein, the adjectives "source", "destination", and "intermediate" are for explanatory purposes only. That is, the components, devices, and collections of devices described using these adjectives are meant only to provide a better understanding to the reader in the context of a particular scenario—not to generally limit the capabilities of those components, devices, and collections of devices. As an example, a "component" may perform certain operation when acting as a "source component" and may perform some of the same and other operations when acting as a "destination component". However, each "component" (whether it be "source" or "destination") may be fully capable of performing the operations of either role.

As used herein, the word "data" is treated as an "uncountable" singular noun—not as the plural form of the singular noun "datum". Accordingly, throughout the application, "data" is paired with a singular verb when written (e.g., "data is"). However, this usage should not be interpreted to redefine "data" to exclusively mean a single bit of information. Rather, as used herein, "data" means any one or more bit(s) of information that are logically and/or physically grouped. Further, "data" may be used as a plural noun if context provides the existence of multiple "data" (e.g., "two data are combined").

FIG. 1 shows a diagram of computing device, in accordance with one or more embodiments. In one or more embodiments, a computing device (100) includes a peripheral bus (104), a field programmable gate array (FPGA) (102), and a module library (106). Each of these components is described below.

In one or more embodiments, a computing device (e.g., computing device (100)) is hardware that includes one or more processor(s), memory (volatile and/or non-volatile), persistent storage, internal physical interface(s) (e.g., serial advanced technology attachment (SATA) ports, peripheral component interconnect (PCI) ports, PCI express (PCIe) ports, next generation form factor (NGFF) ports, M.2 ports, etc.), external physical interface(s) (e.g., universal serial bus (USB) ports, recommended standard (RS) serial ports, audio/visual ports, etc.), communication interface(s) (e.g., network ports, small form-factor pluggable (SFP) ports, wireless network devices, etc.), input and output device(s) (e.g., human interface devices), or any combination thereof. Further, in one or more embodiments, the persistent storage (and/or memory) of the computing device may store computer instructions (e.g., computer code) which, when executed by the processor(s) of the computing device (e.g., as software), cause the computing device to perform one or more processes specified in the computer instructions. Non-limiting examples of a computing device (100) include a network device (e.g., switch, router, multi-layer switch, etc.), a server (e.g., a blade-server in a blade-server chassis, a rack server in a rack, etc.), a personal computer (e.g., desktop, laptop, tablet, smart phone, personal digital assistant), and/or any other type of computing device (100) with the aforementioned capabilities.

In one or more embodiments, a peripheral bus (e.g., peripheral bus (104)) is an electromechanical system that facilitates communication between components in a computing device (100). Non-limiting examples of a peripheral bus (104) include a PCI bus, PCIe bus, SATA bus, NGFF bus, M.2 bus, and/or any other physical connection bus that allow for the attachment of additional components to a computing device (100).

In one or more embodiments, a field programmable gate array (FPGA) (e.g., FPGA (102)) is an integrated circuit capable of being dynamically programmed (i.e., re-programmed) and/or reconfigured for a particular use. That is, unlike other integrated circuits that may have a static configuration when manufactured (e.g., an application-specific integrated circuit (ASIC)), an FPGA (102) allows for the internal circuitry (i.e., the internal logical gates) to be configured, after manufacture, to suit a particular function. Additionally, in one or more embodiments, some portion of an FPGA (102) may be configurable (e.g., the swappable module slot(s) (116)) while leaving the other portions of the FPGA (102) unchanged (e.g., the static module slot(s) (114)) (i.e., making the FPGA (102) capable of "partial reconfiguration"). Further, to modify the configurable components, an FPGA (102) may include one or more components to perform the modifications to the configurable components (e.g., a module loader (112)). In one or more embodiments, an FPGA (102) may include an accelerator command handler (108), one or more static module slot(s) (114), one or more swappable module slot(s) (116), and a module loader (112). In one or more embodiments, an FPGA (102) is capable of performing parallel data operations in two or more module slots (114, 116). That is, as a non-limiting example, an FPGA (102) may accept and process two or more data operation concurrently.

In one or more embodiments, an accelerator command handler (e.g., accelerator command handler (108)) is a component of the FPGA (102) that handles incoming requests to perform data operations and directs those data operations to the appropriate module slot (114, 116). Although the accelerator command handler (108) may be programmed in the FPGA (102) as hardware (i.e., a series of logical gates), the accelerator command handler (108) may, conceptually, be considered as "software" for the functionality it provides. The accelerator command handler (108) may maintain and/or otherwise have access to a module slot tracker (109) that tracks which operation modules (118) currently loaded into each module slot (114, 116). Additional details regarding the functionality of the accelerator command handler (108) may be found in the description of FIG. 3.

In one or more embodiments, a descriptor ring (e.g., descriptor ring (110)) is a data structure that includes one or more descriptor entries (not shown) that each describe a data operation that the FPGA (102) may perform (e.g., a queue of unprocessed data operations). In one or more embodiments, a processor (not shown) of the computing device (100) may generate a queue of unprocessed data operations, where the descriptor entry (110) is some smaller portion of that queue (e.g., the cached portion existing in system memory). Additional details regarding the descriptor ring (110) may be found in the description of FIG. 2A.

In one or more embodiments, a descriptor tracker (e.g., descriptor tracker (111)) is a data structure that includes one or more tracker entries (not shown) that each include data relating to an associated descriptor entry (of the descriptor ring (110)). An FPGA (102) may use the descriptor tracker (111)—and the tracker entries therein—to track the status (e.g., submission, error, completion) of each associated descriptor entry. Additional details regarding the descriptor tracker (111) may be found in the description of FIG. 2B.

In one or more embodiments, a module slot (e.g., static module slot (114) swappable module slot (116)), is a portion of the FPGA (102) (i.e., a series of logical gates) that is configured to perform a specific type of data operation on data (e.g., via an operation module (118)). In one or more embodiments, a static module slot (e.g., static module slot A (114A), static module slot N (114N) may be configured to perform a commonly used data operation (e.g., reading, copying, etc.) that is likely to be needed more often when compared to most other data operations. Although reconfiguration of a static module slot (114) is possible, a static module slot (114) may be considered to remain relatively "static" when compared to a "swappable" module slot (116).

In one or more embodiments, a swappable module slot (e.g., swappable module slot A (116A), swappable module slot N (116N)) may be configured (and re-configured) as needed while the FPGA (102) is actively utilized. A swappable module slot (116) may be configured using a module loader (112) and loaded with an operation module (118) for a data operation needed on-demand (e.g., any data operation that for which there is no idle module slot (114, 116)).

In one or more embodiments, a module loader (e.g., module loader (112)) is a component of the FPGA (102) that handles the reconfiguration of the swappable module slot(s) (116). Although the module loader (112) may be programmed in the FPGA (102) as hardware (i.e., a series of logical gates), the module loader (112) may be conceptually considered as "software" for the functionality it provides. Additional details regarding the functionality of the module loader (112) may be found in the description of FIG. 4.

In one or more embodiments, a module library (e.g., module library (106)) is a data structure that includes one or more operation module(s) (118). The module library (106) may include a data structure (not shown) that provides a searchable list of all operation module(s) (118) available in the module library (106). The module library (106) may be accessed (by the module loader (112)) to load one or more operation module(s) (118) into a swappable module slot (116). In one or more embodiments, the module library (106) is stored on a storage device (not shown) (e.g., memory, persistent storage) and is accessed by the module loader (112) via a peripheral bus (104, or others not shown) in the computing device (100).

In one or more embodiments, an operation module (e.g., operation module A (118A), operation module N (118N)) is a data structure that includes, at least, the configuration and/or instructions for how to configure a swappable module slot (116) to perform the data operation specified in the operation module (118). That is, the operation module (118) includes the instructions on how to reconfigure and/or connect the logical gates in a swappable module slot (116) to perform a specific data operation associated with the operation module (118). Accordingly, when a swappable module slot (116) is configured to perform a specific data operation, the associated operation module (118) may be considered "loaded" into that swappable module slot (116). Non-limiting examples of a data operation include (i) writing, (ii) copying, (iii) compressing, (iv) decompressing, (v) encrypting, (vi) decrypting, (vii) generating hashes, (viii) generating parity data, and/or (ix) any other operation that may be performed on data.

While FIG. 1 shows a specific configuration of a computing device, other configurations may be used without departing from the scope of the disclosed embodiments. Accordingly, embodiments disclosed herein should not be limited to the configuration of devices and/or components shown in FIG. 1.

Figure 2A:
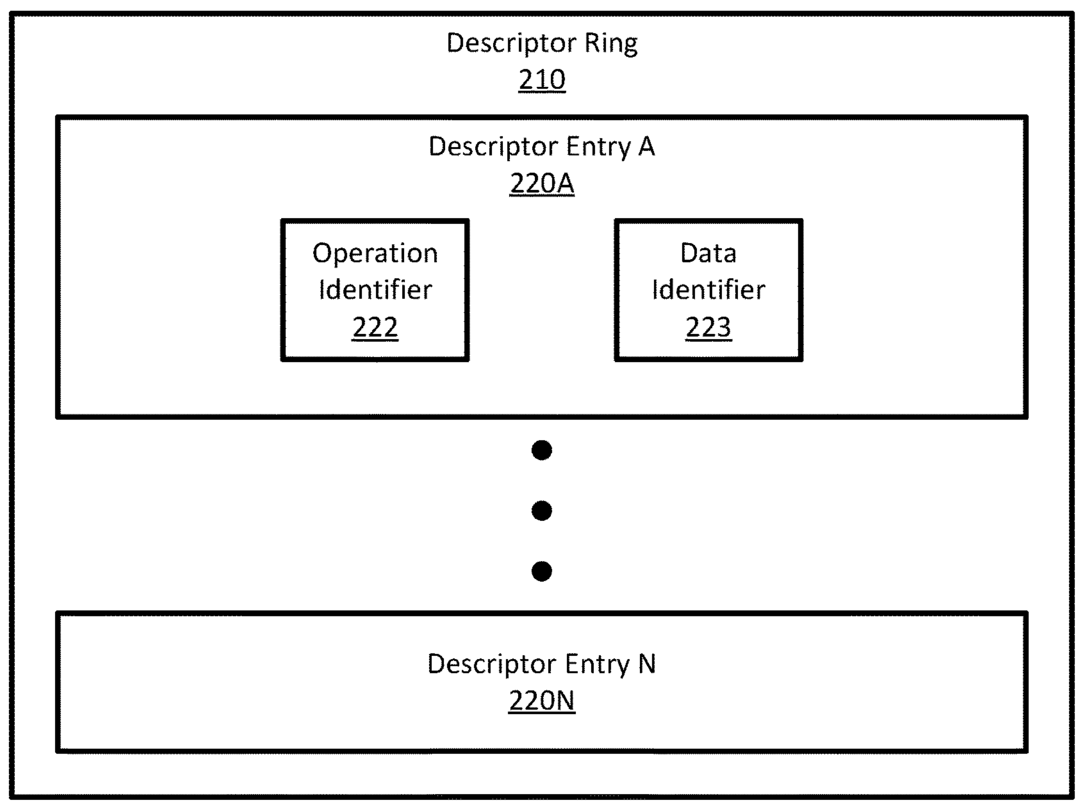
FIG. 2A shows a diagram of descriptor ring, in accordance with one or more embodiments.

FIG. 2A shows a diagram of descriptor ring, in accordance with one or more embodiments. In one or more embodiments, a descriptor ring (210) includes one or more descriptor entries (220), which may further include an operation identifier (222) and a data identifier (223). Each of these components is described below.

In one or more embodiments, a descriptor entry (e.g., descriptor entry A (220A), descriptor entry N (220N)) is a data structure that is specific to a single data operation. Descriptor entries (220), in the descriptor ring (210) may be stored in a first-in-first-out (FIFO) order. That is, a new descriptor entry (220) added to the descriptor ring (210) is added to the "bottom" of the queue and is processed after all other previously added descriptor entries (220).

In one or more embodiments, an operation identifier (e.g., operation identifier (222)) is an alphanumeric expression of one or more letter(s), number(s), symbol(s), and/or other character(s). An alphanumeric expression may be encoded using a standard protocol for digital characters (e.g., Unicode, American Standard Code for Information Interchange (ASCII), etc.). In one embodiment, the operation identifier (222) may uniquely identify the type of data operation to be performed on the associated data (e.g., "COPY", "WRT", "ENCRPT", "DECRPT"). One of ordinary skill in the art, having the benefit of this detailed description, would appreciate that there are many possible variations of alphanumeric expressions that could be used to uniquely identify the type of data operation to be performed.

In one or more embodiments, a data identifier (e.g., data identifier (223)) is the location of the data (or the data itself) on which the data operation will be performed. As a non-limiting example, the data identifier (223) may be a memory address (and length) where the data is located.

While FIG. 2A shows a specific configuration of a descriptor ring, other configurations may be used without departing from the scope of the disclosed embodiments. Accordingly, embodiments disclosed herein should not be limited to the configuration of devices and/or components shown in FIG. 2A.

Figure 2B:
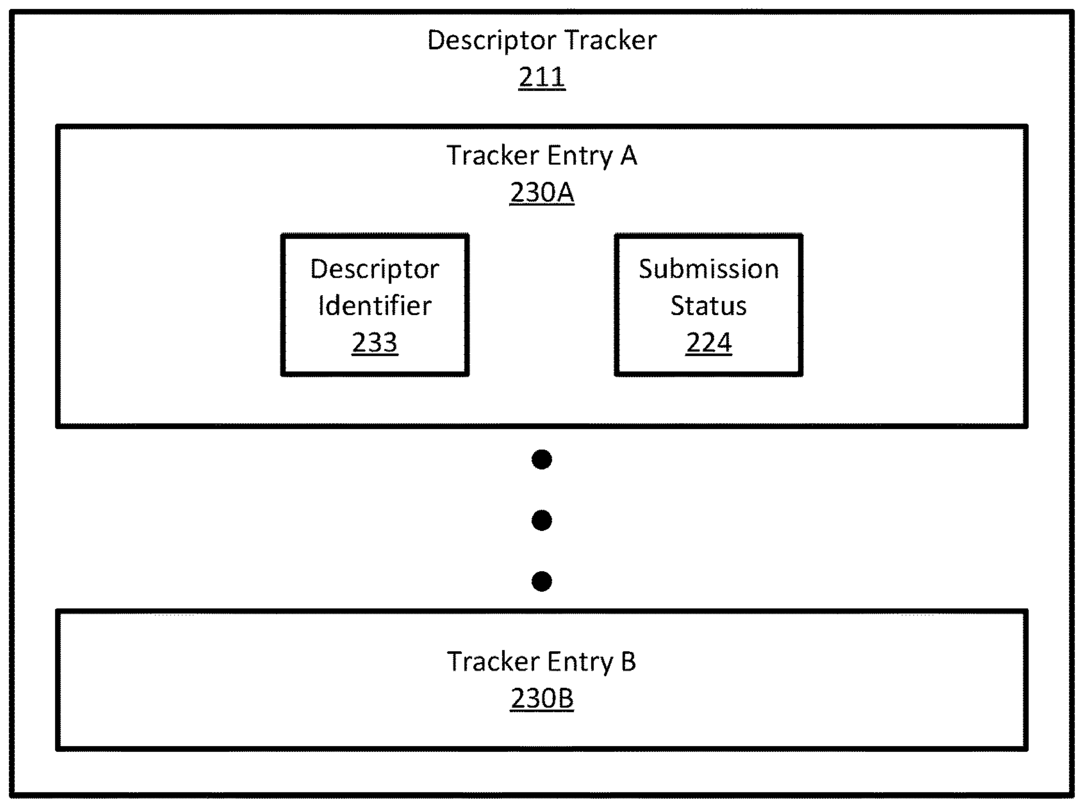
FIG. 2B shows a diagram of descriptor tracker, in accordance with one or more embodiments.

FIG. 2B shows a diagram of descriptor tracker, in accordance with one or more embodiments. In one or more embodiments, a descriptor tracker (211) includes one or more tracker entries (230), which may further include a descriptor identifier (223) and a submission status (224). Each of these components is described below.

In one or more embodiments, a tracker entry (e.g., tracker entry A (230A), tracker entry B (230B)) is a data structure that is specific to a single descriptor identifier (233). And, in one or more embodiments, a descriptor identifier (e.g., descriptor identifier (233)) is an alphanumeric expression that uniquely identifies a descriptor entry (220). That is, for each descriptor entry (220), there is a uniquely associated tracker entry (230) that the accelerator command handler may use to track the status of the associated descriptor entry (220).

In one or more embodiments, a submission status (e.g., submission status (224)) is data that indicates whether the accelerator command handler has begun processing the descriptor entry (220) specified by the descriptor identifier (233) (i.e., whether the descriptor entry (220) has been submitted to the accelerator command handler). That is, in one or more embodiments, once the accelerator command handler begins to process a descriptor entry (220), the accelerator command handler modifies the submission status (224) to indicate that the descriptor entry (220) has been "submitted". Accordingly, by setting the submission status (224), when the accelerator command handler scans the descriptor ring (210) for unprocessed descriptor entries (220), any descriptor entry with a submission status (224) of "submitted" may be ignored. A non-limiting example of a submission status (224) is an alphanumeric expression that includes letters and/or numbers about the submission (i.e., "submitted", "not submitted", "yes", "no", etc.). As another non-limiting example, the submission status (224) may be a single bit, where "0" indicates "not submitted" and "1" indicates "submitted".

While FIG. 2B shows a specific configuration of a descriptor tracker, other configurations may be used without departing from the scope of the disclosed embodiments. Accordingly, embodiments disclosed herein should not be limited to the configuration of devices and/or components shown in FIG. 2B.

Figure 3:
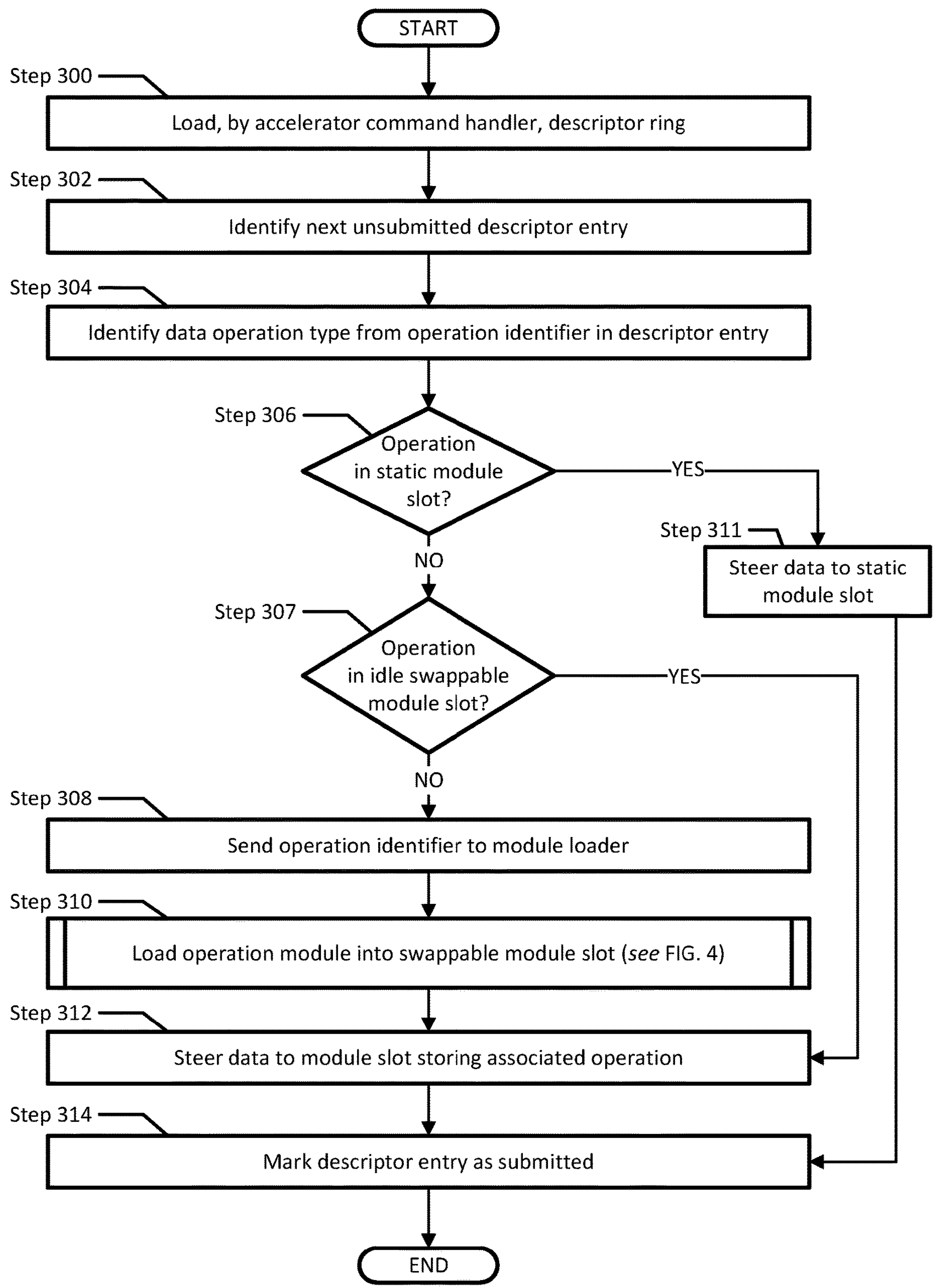
FIG. 3 shows a flowchart of a method of loading and steering data operations, in accordance with one or more embodiments.

FIG. 3 shows a flowchart of a method of loading and steering data operations, in accordance with one or more embodiments. All or a portion of the method shown may be performed by one or more components of the FPGA. However, another component of the system may perform this method without departing from the embodiment disclosed herein. While the various steps in this flowchart are presented and described sequentially, one of ordinary skill in the relevant art will appreciate that some or all of the steps may be executed in different orders, combined, or omitted, and some or all steps may be executed in parallel.

In Step 300, the accelerator command handler loads (i.e., copies) the descriptor ring to the FPGA. In one or more embodiments, the descriptor ring is loaded from the computing device (100) (e.g., from a processor and/or memory of the computing device). In one or more embodiments, the accelerator command handler copies the descriptor ring to the memory of the FPGA. As discussed in the description of FIG. 1, the descriptor ring may be a smaller portion of a larger queue of unprocessed data operations existing in the computing device (e.g., the descriptor ring may be a copy of the cached portion of that larger queue).

In Step 302, the accelerator command handler identifies the next unsubmitted descriptor entry in the descriptor ring. In one or more embodiments, the accelerator command handler parses the tracker entry (associated with the descriptor entry) and reads the submission status to determine if the accelerator command handler has already processed the descriptor entry. If a tracker entry includes a submission status that indicates that the descriptor entry has already been "submitted", the accelerator command handler skips that descriptor entry and analyzes the next descriptor entry in the descriptor ring. If, however, the submission status indicates that the descriptor entry is "unsubmitted" (or "not yet submitted"), the accelerator command handler proceeds with that descriptor entry for processing.

In Step 304, the accelerator command handler identifies the data operation from the operation identifier in the descriptor entry. In one or more embodiments, the accelerator command handler parses the descriptor entry and reads the operation identifier to determine what data operation is going to be needed in the FPGA to process the data.

In Step 306, the accelerator command handler checks the module slot tracker to determine if the operation identified (in Step 304) is loaded into (i.e., present) any of the static module slots. In one or more embodiments, the accelerator command handler enforces a preference for static module slots. The accelerator command handler may first identify is a static module slot includes the identified data operation and, if existing, use that static module slot regardless of idle status.

If the associated data operation is not present in a static module slot (Step 306-NO), the method proceeds to Step 307. However, if the associated data operation exists in a static module slot (Step 306-YES), the method proceeds to Step 311.

In Step 307, the accelerator command handler checks the module slot tracker to determine if the data operation identified (in Step 304) is loaded into (i.e., present) in any of the swappable module slots and if that swappable module slot is and idle (i.e., available) or almost idle (i.e., will be available within a certain time threshold). In one or more embodiments, if the swappable module slot is not idle (i.e., is in use), the accelerator command handler makes a second determination if the swappable module slot will soon be available (i.e., if the swappable module slot is almost idle). In such an instance, if the swappable module slot is almost idle, the accelerator command handler may consider the swappable module slot as "idle", and proceed accordingly.

In one or more embodiments, a data operation may be considered "unavailable" if the data operation is (i) not loaded into any swappable module slot, or (ii) loaded into one or more swappable module slot(s), but none of those swappable module slot(s) are idle (or are not soon to be idle). Further, a data operation may be considered "available" if the data operation is (i) loaded into a swappable module slot, where (ii) that swappable module slot is also idle (or soon to be idle).

If the associated data operation is not present in a swappable module slot (Step 307-NO), the method proceeds to Step 308. If the associated data operation is present in one or more swappable module slot(s), but those swappable module slots are not idle (Step 307-NO), the method proceeds to Step 308. However, if the associated data operation exists in a swappable module slot that is idle (or almost idle) (Step 307-YES), the method proceeds to Step 312.

In Step 308, the accelerator command handler sends the operation identifier to the module loader, after having determined that the data operation is not present in any of the module slots of the FPGA (or, if present, all of those module slots are not idle). In one or more embodiments, the accelerator command module may wait until a swappable module slot is idle before sending the operation identifier to the module loader.

In Step 310, the module loader loads the operation module (for the identified type of data operation) into one of the swappable module slots. Additional details regarding the loading the operation module into a swappable module slot may be found in the description of FIG. 4. After the completion of Step 310, the method may proceed to Step 312.

In Step 311, the accelerator command handler steers (i.e., directs, forwards, sends) the data (on which the data operation is going to be performed) to the static module slot that includes the operation module associated with the operation identifier (identified in Step 306). After the completion of Step 311, the method may proceed to Step 314.

In Step 312, the accelerator command handler steers (i.e., directs, forwards, sends) the data (on which the data operation is going to be performed) to the swappable module slot that includes the operation module associated with the operation identifier. In one or more embodiments, the accelerator command handler is informed, by the module loader, of the operation modules loaded into each swappable module slot. In one or more embodiments, the module loader may provide an updated mapping of the module slots to the accelerator command handler by updating the module slot tracker in the FPGA.

In Step 314, the accelerator command marks the descriptor entry as "submitted" by modifying the submission status of the tracker entry to indicate that the descriptor entry has now been processed by the accelerator command handler. In one or more embodiments, if the FPGA is unable to process the data operation (e.g., due to some error, lacking a compatible operation module, no processing capacity in an idle module slot, etc.), the data operation may be processed by a general-purpose processor of the computing device (i.e., not offloaded to the FPGA). Although the method of FIG. 3 (and FIG. 4) describes the process of handling a single descriptor entry, the process of FIG. 3 (and FIG. 4) may repeat for any number of descriptor entries in the descriptor ring.

Figure 4:
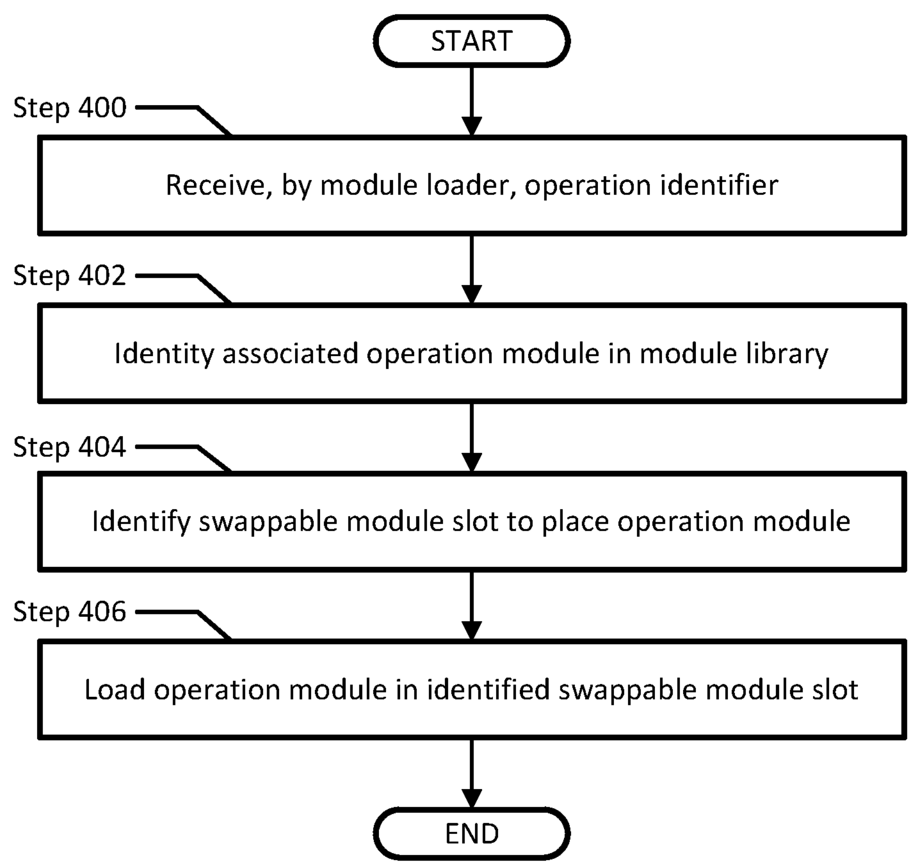
FIG. 4 shows a flowchart of a method of loading an operation module, in accordance with one or more embodiments.

FIG. 4 shows a flowchart of a method of loading an operation module, in accordance with one or more embodiments. All or a portion of the method shown may be performed by one or more components of the FPGA. However, another component of the system may perform this method without departing from the embodiment disclosed herein. While the various steps in this flowchart are presented and described sequentially, one of ordinary skill in the relevant art will appreciate that some or all of the steps may be executed in different orders, combined, or omitted, and some or all steps may be executed in parallel.

In Step 400, the module loader receives an operation identifier. In one or more embodiments, the operation identifier may be sent by the accelerator command handler, or any other component of the computing device.

In Step 402, the module loader identifies the operation module, in the module library, associated with the data operation specified in the operation identifier. In one or more embodiments, the module loader performs a lookup to identify an operation module that matches the operation identifier (received in Step 400).

In Step 404, the module loader identifies a swappable module slot to place the identified operation module into. In one or more embodiments, the module loader identifies any empty swappable module slot (if present) to include the identified operation module. Alternatively, if each swappable module slot includes an operation module, the module loader may use one or more methods to identify which swappable module slot should be overwritten. Further, in one or more embodiments, the module loader may only overwrite a swappable module slot that is idle (i.e., only idle swappable module slots are considered for placement of an operation module).

Non-limiting examples of criteria and algorithms the module loader may use to identify an idle swappable module slot to overwrite, include (i) identifying the swappable module slot that is the "least recently used" (LRU), (ii) identifying the least used (i.e., used the least frequently) swappable module slot, (iii) using one or more predictive techniques (e.g., analyzing the descriptor ring) to identify a swappable module slot that will be used last (i.e., used after each of the other operation modules in the other swappable module slots), etc.

In Step 406, the module loader loads the identified operation module (identified in Step 402) into the identified swappable module slot (identified in Step 404). In one or more embodiments, if the swappable module slot already includes an operation module, the module loader overwrites the configuration with the newly identified operation module.

In one or more embodiments, after loading the operation module into the swappable module slot, the module loader may notify the accelerator command handler that the swappable module slot now includes the operation module matching the operation identifier (received in Step 400). In one or more embodiments, the module loader may notify the accelerator command handler by updating the module slot tracker to indicate that the identified swappable module slot now includes the identified operation module.

In one or more embodiments, two or more swappable module slots may be loaded with the same operation module (i.e., for the same data operation). As a non-limiting example, consider a scenario where there are ten swappable module slots and a series of the same "compress" data operations are requested (e.g., for a large compression task), the accelerator command handler (in conjunction with the module loader) may load a "compress" operation module into each of the ten swappable module slots—thereby providing increased capacity for offloading the "compress" data operations.

As another non-limiting example, consider a scenario where there are ten swappable module slots and a series "encrypt" data operations are requested. However, the "encrypt" data operations are incoming slow enough that the FPGA is able to process each of the data operations using only six (of the ten) swappable module slots. In such a scenario, the accelerator command handler (and module loader) would overwrite six of the swappable module slots (using the methods of FIGS. 3 and 4). However, once six swappable module slots are loaded with "encrypt" operations modules, the accelerator command handler would be able to consistently identify an idle "encrypt" swappable module slot, and steer the data operation accordingly (without having to overwrite a seventh swappable module slot).

As another non-limiting example, consider a scenario where there are nine swappable module slots and large number of "decrypt" and "decompress" data operations are requested (assumed to be relatively equal for the purposes of this example. The accelerator command handler (and module loader) may load four swappable module slots with "decrypt" and four others with "decompress". Further, depending on the algorithm used, the number of each type of data operation, and the time to perform each data operation, the ninth swappable module slot may be (i) loaded back-and-forth (with "decrypt" and "decompress") as the algorithm dictates whichever is needed, or (ii) loaded with either a "decrypt" or "decompress" (thereby allowing one type of data operation to be offloaded more than the other).

Considering the non-limiting examples above, one of ordinary skill in the art (given the benefit of this detailed description) would appreciate how the disclosed algorithm(s) cause the FPGA to load the swappable module slots with the most optimal operation modules based on the data operations requested in the descriptor ring. That is, the FPGA is configured to proactively reconfigure itself for upcoming data operations, thereby allowing for increased hardware offloading to the FPGA. Further, the system and methods described herein provide for FPGA self-tuning that is not dependent on software executing elsewhere in the computing device (e.g., proprietary, user space software). Further, new and existing standards may fully utilize the FPGA's increased capabilities, as the internalized and transparent nature of the FPGA reconfigurations allows for increased extensibility (e.g., using the smart data accelerator interface (SDXI)).

While one or more embodiments have been described herein with respect to a limited number of embodiments and examples, one of ordinary skill in the art, having the benefit of this detailed description, would appreciate that other embodiments can be devised which do not depart from the scope of the embodiments disclosed herein. Accordingly, the scope should be limited only by the attached claims.

What is claimed is:

1. A method for offloading data operations to a field programmable gate array (FPGA), comprising:
  loading, by the FPGA, a descriptor ring;
  performing a first lookup, in the descriptor ring, to identify a first descriptor entry;
  identifying, in the first descriptor entry, a first data operation;
  making a first determination that the first data operation is unavailable in any of a plurality of module slots of the FPGA; and
  based on the first determination:
    loading a first operation module, matching the first data operation, into a first swappable module slot of the plurality of module slots;
    steering first data, associated with the first descriptor entry, to the first swappable module slot for processing;
    performing a second lookup, in the descriptor ring, to identify a second descriptor entry;
    identifying, in the second descriptor entry, a second data operation, wherein the second data operation is the same as the first data operation;
    making a second determination that the second data operation is available in the first swappable module slot;
    based on the second determination:
      steering second data, associated with the second descriptor entry, to the first swappable module slot for processing.

2. The method of claim 1, wherein loading the first operation module into the first swappable module slot, comprises:
  identifying, in a module library of the FPGA, the first operation module;
  identifying the first swappable module slot; and
  writing a configuration, associated with the first operation module, to the first swappable module slot.

3. The method of claim 2, wherein identifying the first operation module, comprises:
  comparing the first data operation against a plurality of operation modules in the module library, wherein the plurality of operation modules comprises the first operation module.

4. The method of claim 2, wherein identifying the first swappable module slot, comprises:
  identifying a second data operation, in the descriptor ring, that is going to be used after a plurality of other data operations in the descriptor ring are going to be used; and
  identifying a second swappable module slot that comprises a second operation module associated with the second data operation.

5. The method of claim 2, wherein after writing the configuration to the first swappable module slot, the method further comprises:
  updating a module slot tracker, of the FPGA, to indicate that the first swappable module slot is loaded with the first operation module.

6. The method of claim 5, wherein making the first determination that the first data operation is unavailable in any of the plurality of module slots, comprises:
  performing a third lookup, in the module slot tracker, and failing to identify the first operation module.

7. The method of claim 1, wherein after steering the first data to the first swappable module slot, the method further comprises:
  making a third determination that the first swappable module slot is not idle; and
  based on the third determination:
    loading the first operation module into a second swappable module slot of the plurality of module slots; and
    steering the second data, associated with the second descriptor entry, to the second swappable module slot for processing.

8. A non-transitory computer readable medium comprising instructions which, when executed by a field programmable gate array (FPGA), enables the FPGA to perform a method for offloading data operations to the FPGA, comprising:
  loading, by the FPGA, a descriptor ring;
  performing a first lookup, in the descriptor ring, to identify a first descriptor entry;
  identifying, in the first descriptor entry, a first data operation;
  making a first determination that the first data operation is unavailable in any of a plurality of module slots of the FPGA; and
  based on the first determination:
    loading a first operation module, matching the first data operation, into a first swappable module slot of the plurality of module slots;
    steering first data, associated with the first descriptor entry, to the first swappable module slot for processing;
    performing a second lookup, in the descriptor ring, to identify a second descriptor entry;
    identifying, in the second descriptor entry, a second data operation, wherein the second data operation is the same as the first data operation;
    making a second determination that the second data operation is available in the first swappable module slot;
    based on the second determination:
      making a third determination that the first swappable module slot is not idle;
      based on the third determination:
        loading the first operation module into a second swappable module slot of the plurality of module slots; and
        steering second data, associated with the second descriptor entry, to the second swappable module slot for processing.

9. The non-transitory computer readable medium of claim 8, wherein after steering the first data to the first swappable module slot, the method further comprises:
  steering the second data, associated with the second descriptor entry, to the first swappable module slot for processing.

10. The non-transitory computer readable medium of claim 8, wherein loading the first operation module into the first swappable module slot, comprises:
  identifying, in a module library of the FPGA, the first operation module;
  identifying the first swappable module slot; and
  writing a configuration, associated with the first operation module, to the first swappable module slot.

11. The non-transitory computer readable medium of claim 10, wherein identifying the first operation module, comprises:

comparing the first data operation against a plurality of operation modules in the module library, wherein the plurality of operation modules comprises the first operation module.

12. The non-transitory computer readable medium of claim 10, wherein identifying the first swappable module slot, comprises:

identifying a second data operation, in the descriptor ring, that is going to be used after a plurality of other data operations in the descriptor ring are going to be used; and identifying a second swappable module slot that comprises a second operation module associated with the second data operation.

13. The non-transitory computer readable medium of claim 10, wherein after writing the configuration to the first swappable module slot, the method further comprises:

updating a module slot tracker, of the FPGA, to indicate that the first swappable module slot is loaded with the first operation module.

14. The non-transitory computer readable medium of claim 13, wherein making the first determination that the first data operation is unavailable in any of the plurality of module slots, comprises:

performing a third lookup, in the module slot tracker, and failing to identify the first operation module.

15. A field programmable gate array (FPGA) configured to perform a method for offloading data operations, comprising:

loading a descriptor ring;

performing a first lookup, in the descriptor ring, to identify a first descriptor entry;

identifying, in the first descriptor entry, a first data operation;

making a first determination that the first data operation is unavailable in any of a plurality of module slots of the FPGA; and based on the first determination:

loading a first operation module, matching the first data operation, into a first swappable module slot of the plurality of module slots, comprises:

identifying, in a module library of the FPGA, the first operation module;

identifying the first swappable module slot; and writing a configuration, associated with the first operation module, to the first swappable module slot.

16. The FPGA of claim 15, wherein after loading the first operation module into the first swappable module slot, the method further comprises:

steering first data, associated with the first descriptor entry, to the first swappable module slot for processing.

* * * * *